(12) United States Patent
VanderSluis

(10) Patent No.: US 7,190,102 B2
(45) Date of Patent: Mar. 13, 2007

(54) APPARATUS AND METHOD FOR CHARGING AND DISCHARGING A CAPACITOR TO A PREDETERMINED SETPOINT

(75) Inventor: Donald VanderSluis, Sarasota, FL (US)

(73) Assignee: Viking Technologies, L.C., Sarasota, FL (US)

( * ) Notice: Subject to any disclaimer, the term of this patent is extended or adjusted under 35 U.S.C. 154(b) by 187 days.

(21) Appl. No.: 10/630,065

(22) Filed: Jul. 30, 2003

(65) Prior Publication Data

US 2004/0046527 A1   Mar. 11, 2004

Related U.S. Application Data

(60) Provisional application No. 60/408,468, filed on Sep. 5, 2002.

(51) Int. Cl.
H02N 2/06 (2006.01)
H02N 2/16 (2006.01)

(52) U.S. Cl. ............... 310/316.03; 310/317; 318/116; 320/166

(58) Field of Classification Search ........ 310/316.03, 310/317; 318/116; 320/166
See application file for complete search history.

(56) References Cited

U.S. PATENT DOCUMENTS

| | | | | |
|---|---|---|---|---|
| 4,520,289 A | | 5/1985 | Sato et al. ............ 310/316.03 |
| 4,558,391 A | * | 12/1985 | Ward et al. .................. 361/155 |
| 4,625,137 A | * | 11/1986 | Tomono .................... 310/317 |
| 4,667,279 A | | 5/1987 | Maier ......................... 363/46 |
| 4,686,338 A | | 8/1987 | Kashiwagi et al. | |
| 4,732,129 A | * | 3/1988 | Takigawa et al. ...... 310/316.03 |
| 4,736,131 A | | 4/1988 | Fujimoto ................... 310/328 |
| 4,749,897 A | | 6/1988 | Natsume et al. ............ 310/317 |
| 4,808,874 A | | 2/1989 | Stahlhuth .................... 310/328 |
| 4,866,326 A | | 9/1989 | Niikawa et al. ............ 310/315 |
| 4,947,074 A | | 8/1990 | Suzuki .................. 310/316.03 |
| 4,973,876 A | | 11/1990 | Roberts ................. 310/316.03 |

(Continued)

FOREIGN PATENT DOCUMENTS

EP   0325764   8/1989

(Continued)

OTHER PUBLICATIONS

The International Search Report dated Oct. 30, 2003.

(Continued)

Primary Examiner—Darren Schuberg
Assistant Examiner—J. Aguirrechea
(74) Attorney, Agent, or Firm—Young & Basile, P.C.

(57) ABSTRACT

An apparatus using electrically-stimulated smart material requires a power source to stimulate the material. This power source has three main functions, (1) to apply a known voltage potential across the smart material, (2) to convert from the control voltage to a level suitable for the smart material, and (3) to regulate the voltage based on a control input. The power source is a DC to DC converter with special properties achieved by supplying a variable stimulating voltage or actively discharging the actuator. The circuit also provides a dead band, or hysteresis, between the charge point and discharge point. When this circuit is applied with a proportional, mechanically-leveraged smart material actuator, a general-purpose industrial actuator becomes a cost-effective solution.

44 Claims, 4 Drawing Sheets

U.S. PATENT DOCUMENTS

| | | | |
|---|---|---|---|
| 5,036,263 | A | 7/1991 | Yamada et al. ............. 318/116 |
| 5,053,668 | A | 10/1991 | Mitsuyasu .................. 310/317 |
| 5,130,598 | A | 7/1992 | Verheyen et al. ...... 310/316.03 |
| 5,138,217 | A | 8/1992 | Wada et al. ........... 310/323.21 |
| 5,316,013 | A | 5/1994 | Striebel et al. ............. 128/754 |
| 5,333,455 | A | 8/1994 | Yoshioka ..................... 60/533 |
| 5,388,751 | A | 2/1995 | Harada et al. ............... 228/4.5 |
| 5,465,021 | A | 11/1995 | Visscher et al. ............ 310/328 |
| 5,479,062 | A * | 12/1995 | Yoshino ................ 310/316.03 |
| 5,543,679 | A | 8/1996 | Morino et al. ......... 310/316.03 |
| 5,548,502 | A * | 8/1996 | Kosugi ........................ 363/22 |
| 5,604,673 | A | 2/1997 | Washburn et al. .......... 363/147 |
| 5,895,998 | A | 4/1999 | Saylor .................. 310/316.01 |
| 5,962,951 | A | 10/1999 | Bishop .................. 310/316.03 |
| 6,109,245 | A | 8/2000 | Egger et al. ................ 123/490 |
| 6,133,714 | A | 10/2000 | Hoffmann et al. .......... 320/166 |
| 6,137,208 | A * | 10/2000 | Hoffmann et al. ..... 310/316.03 |
| 6,147,433 | A | 11/2000 | Reineke et al. ........ 310/316.03 |
| 6,236,190 | B1 * | 5/2001 | Hoffmann et al. .......... 320/166 |
| 6,459,244 | B1 * | 10/2002 | Hoffmann et al. .......... 320/166 |
| 6,870,305 | B2 | 3/2005 | Moler |
| 6,895,940 | B2 * | 5/2005 | Igashira ...................... 123/472 |
| 2001/0030306 | A1 | 10/2001 | Schrod ........................ 336/200 |
| 2002/0121958 | A1 * | 9/2002 | Schord ........................ 336/200 |
| 2004/0035106 | A1 | 2/2004 | Moler et al. |
| 2004/0045148 | A1 | 3/2004 | Moler |
| 2005/0029905 | A1 * | 2/2005 | Dal et al. ................... 310/317 |
| 2005/0195044 | A1 * | 9/2005 | Hitomi et al. .............. 331/175 |
| 2005/0231170 | A1 * | 10/2005 | Augesky ..................... 320/166 |

FOREIGN PATENT DOCUMENTS

| | | |
|---|---|---|
| EP | 0 641 066 A1 | 3/1995 |
| EP | 1 067 608 A1 | 1/2001 |
| EP | 1 139 448 A1 | 10/2001 |
| EP | 1 182 341 A1 | 2/2002 |
| JP | 60-180026 | 9/1985 |
| JP | 6129781 | 12/1986 |
| JP | 01185175 | 7/1989 |
| JP | 07213061 | 8/1996 |
| WO | WO 01/22502 A1 | 9/2000 |
| WO | WO 01/04481 A1 | 1/2001 |
| WO | WO 01/33061 A1 | 5/2001 |
| WO | WO 0178160 | 10/2001 |

OTHER PUBLICATIONS

How to Use Inductor Type EMI Suppression Filters, 'Online, p. 23 XP002266191, <URL: http://www.murata.com/emc/knowhow/pdfs/tel5ey/23e.pdf>, 'retrieved on Dec. 31, 2003.

Bielawskia John et al: "Low Profile LTCC Transformers", 2002 International Symposium on Microelectronics; Denver, Co, U.S., Sep. 4-6, 2002, 'Online, vol. 4931, 2002, pp. 76-80, XP002266192 Proc SPIE Int. Soc Opt Eng; Proceedings of SPIE—The International Society for Optical Engineering 2002, Retrieved from the Internet: <URL:http://www.electroscience.com/publications/IMAPS2002(1).pdf> retrieved on Dec. 26, 2003, the whole document.

\* cited by examiner

APPARATUS AND METHOD FOR CHARGING AND DISCHARGING A CAPACITOR TO A PREDETERMINED SETPOINT

CROSS-REFERENCE TO RELATED APPLICATIONS

This application is a continuation of U.S. Provisional Application No. 60/408,468 filed on Sep. 5, 2002 which is incorporated by reference herein. This application is related to U.S. patent application Ser. No. 10/621,797 filed on Jul. 17, 2003 for an Apparatus and Method for Charging and Discharging a Capacitor.

FIELD OF THE INVENTION

The present invention relates to electronic methods and circuits for controlling proportional general purpose, smart material-based actuators.

BACKGROUND OF THE INVENTION

Actuator technologies are being developed for a wide range of applications. One example includes a mechanically-leveraged smart material actuator that changes shape in response to electrical stimulus. This change in shape is proportional to the input voltage. Since this shape change can be effectuated predominantly along a single axis, such actuators can be used to perform work on associated mechanical systems including a lever in combination with some main support structure. Changes in axial displacement are magnified by the lever to create an actuator with a useful amount of force and displacement. Such force and displacement is useful for general-purpose industrial valves, clamps, beverage dispensers, compressors or pumps, brakes, door locks, electric relays, circuit breakers, and other applications actuated by means including solenoids, motors or motors combined with various transmission means. Smart materials, however, and piezoelectric materials specifically, can require hundreds of volts to actuate and cause displacement. This type of voltage may not be readily available and may have to be derived from a lower voltage as one would find with a battery.

Another characteristic of piezoelectric materials is that the materials are capacitive in nature. Moreover, a single actuator is often controlled using three separate signals: a control signal, a main supply and a ground.

SUMMARY OF THE INVENTION

An apparatus for charging and discharging a capacitor to predetermined setpoints includes a smart material actuator and a voltage controlled direct current (DC) to DC converter for operating the smart material actuator in a proportional manner. The voltage controlled DC to DC converter can further include a self-oscillating drive circuit connected to a primary coil of a transformer with push-pull drive signals 180 degrees out of phase. The voltage controlled DC to DC converter can also include an auxiliary coil on the transformer. An attached diode rectifier to generate a DC voltage from an AC signal of the secondary coil on the transformer can also be included with the DC to DC converter as well as a voltage feedback network for voltage regulation.

The voltage controlled DC to DC converter can further include control circuitry for stopping and starting the self-oscillating mechanism and can also feature a diode on an input stage for reverse polarity protection. Moreover, the control circuitry can further include a bead inductor and bypass capacitor for suppression of radiated EMI into the power source of the system.

Another feature of the invention includes a smart material drive circuit for actively charging and discharging the smart material actuator in response to connecting and disconnecting a power source, respectively. The drive circuit for actively controlling at least one of charging and discharging the smart material actuator can be responsive to a control signal.

Yet another embodiment of the invention for charging and discharging a capacitor to predetermined setpoints includes a smart material actuator, a power source connectible to the smart material actuator, and a switch circuit for actively discharging the smart material actuator in response to removal of the connection to the power source. The switch circuit for actively charging the smart material actuator can further be responsive to connecting the power source or a control signal input. The switch circuit can actively control at least one of charging and discharging the smart material actuator in response to a control signal and can further include a voltage comparator and field effect transistor (FET) to control the DC to DC converter. The switch can, according to the invention, have three operational modes, charge load, hold load and discharge load. Hence, the method for charging and discharging a capacitor to predetermined setpoints according to the present invention includes the steps of providing a smart material actuator and operating the smart material actuator in a proportional manner with a voltage controlled DC to DC converter. An alternative method for charging and discharging a capacitor to predetermined setpoints according to the invention includes the steps of providing a smart material actuator, connecting a power source to the smart material actuator, and actively discharging the smart material actuator in response to removal of the connection to the power source with a switch circuit.

With the use of electronic design and simulation software and electronic prototyping of the circuit, details for using a minimum number of components while maintaining a cost-effective, and low power solution are realized. This electronic subsystem, when coupled to a mechanically-leveraged smart material actuator, creates a commercially viable proportional actuator solution for general purposes and industrial applications.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DESCRIPTION OF THE PREFERRED EMBODIMENT

Figure 1:
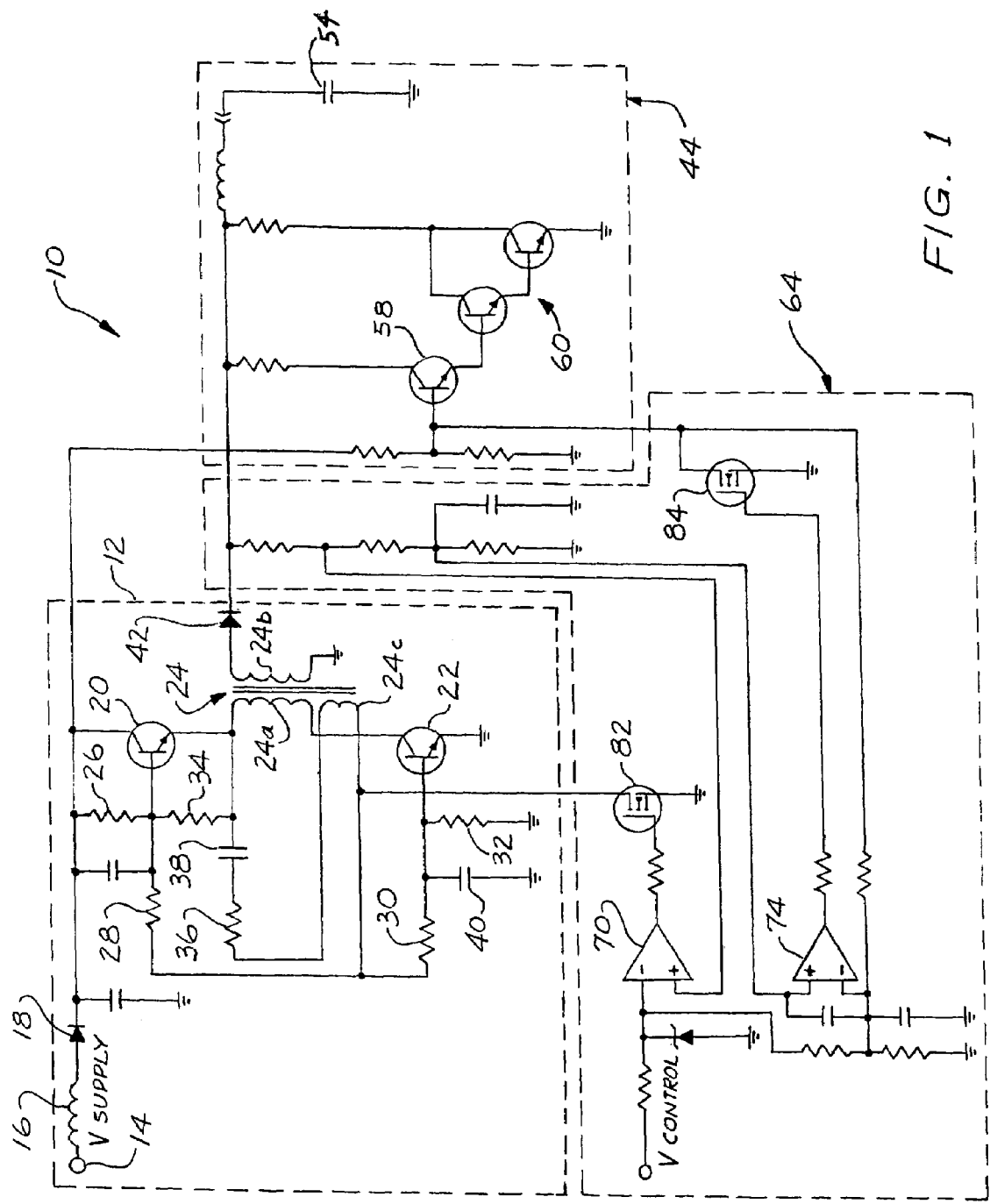
FIG. 1 is an electronic schematic of a voltage controlled DC to DC converter with active regulation to which the present invention is applied.

FIG. 1 shows an electronic schematic of a system 10 for controlling a proportional mechanically leveraged smart material actuator (shown as capacitor 54) including a specialized power source 12 coupled to switching circuitry 44 and control circuitry 64.

Figure 2:
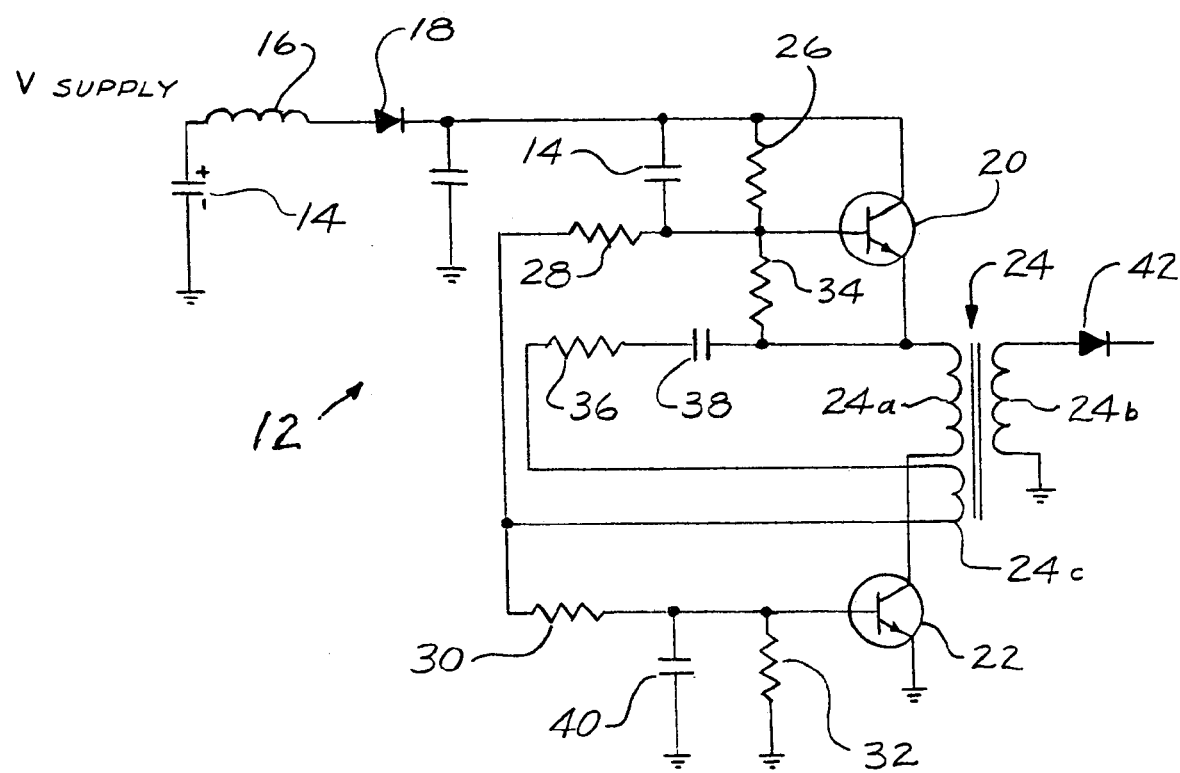
FIG. 2 is an electronic schematic of a DC to DC converter of the present invention.

According to the preferred embodiment, the system 10 of FIG. 1 is a DC to DC converter, switching circuit, and control circuit operative either to supply a variable stimulating voltage or to actively discharge the actuator. As best shown in FIG. 2, the DC to DC converter 12 includes a supply voltage 14 connected to a bead inductor 16 in series with a reverse protection diode 18. Bead inductor 16 acts as a filter to remove noise generated by the collector of negative positive negative (NPN) transistor 20 connected to the supply voltage 14. NPN transistor 20 and NPN transistor 22 form a push-pull driver for transformer 24. Resistors 26, 28, 30 and 32 form resistive voltage dividers and set the basic bias points for NPN transistors 20 and 22.

Transformer 24 is wound not only with a primary coil 24a and a secondary coil 24b, but also with an auxiliary coil 24c. Auxiliary winding 24c resistors 34, 36, 28, and capacitors 38, 40 form feedback means to cause oscillation on the base of NPN transistors 20, 22. Oscillation is 180 degrees out of phase between the two NPN transistors 20, 22, forming a self-oscillating push-pull transformer driver. The secondary coil 24b of transformer 24 is connected to a rectifier in the form diode 42. It should be noted that when the base of transistor 22 is grounded, the self-oscillating mechanism is stopped. When the ground is removed, the self-oscillating mechanism is restarted. As shown in FIG. 1, switch circuitry 44, when commanded, is capable of actively controlling the voltage to the capacitive load.

Control circuitry 64 monitors the control voltage and output voltage and makes the decision to turn on the DC to DC converter, or turn on the discharge switch, or hold the current voltage level at the capacitive load. Included in the system is means for forcing the load to ground should the supply voltage be removed.

Figure 3:
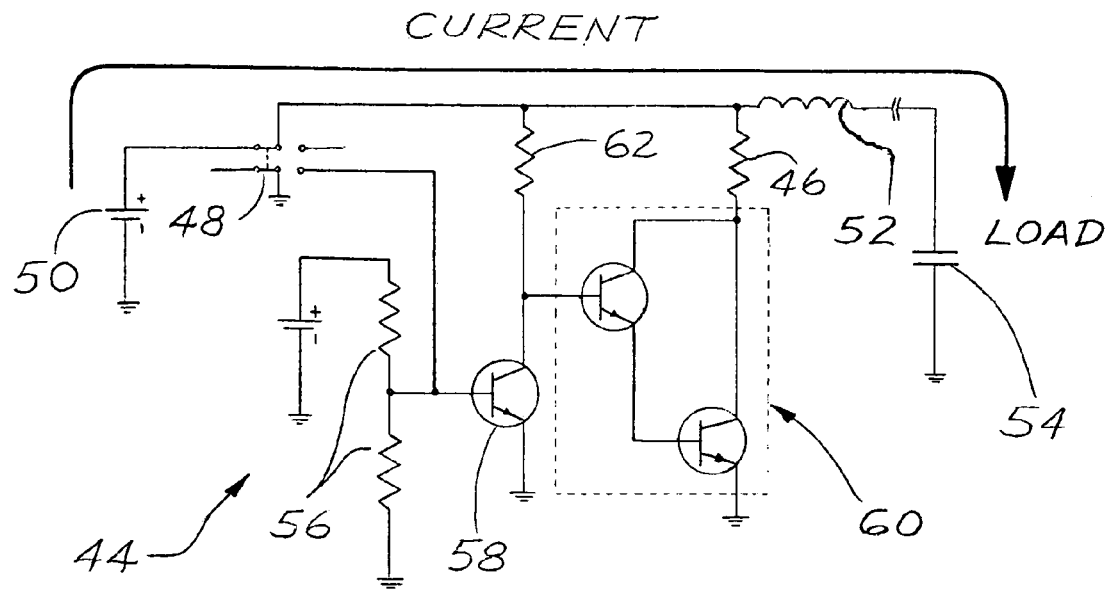
FIG. 3 is an electronic schematic of the electronic switch of the present invention illustrating current flow when the switch is closed.

Referring now to FIG. 3, switching circuitry 44 is depicted isolated from the schematic of FIG. 1 to better illustrate the operative features of the switching circuitry 44 when it is closed. When switch 48 is closed, current flows from a power source 50 through switch 48 and through bead inductor 52, charging the capacitive load 54. Also, current flows into resistive voltage divider 56 driving the NPN transistor 58 on, which turns NPN Darlington pair 60 off. The rate of charge is determined by the impedance of the power source 50 and the capacitance of the load 54. Resistor 62 and NPN transistor 58 serve as a level translator between the switched power and control signal, so the switched power and control signal do not have to have the same voltage levels.

Figure 4:
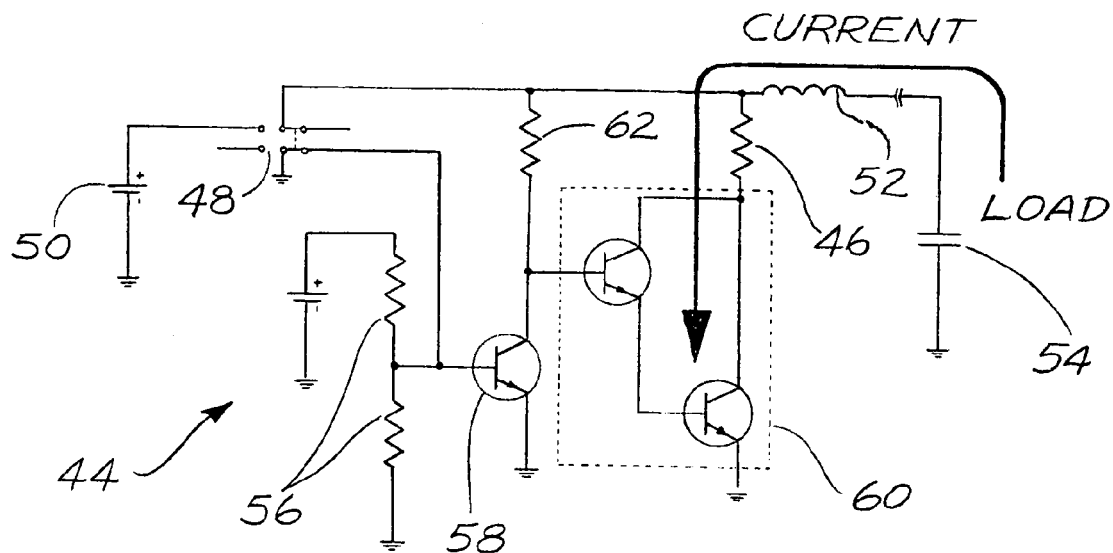
FIG. 4 is an electronic schematic of the electronic switch of the present invention illustrating current flow when the switch is open.

Referring now to FIG. 4, the current flow in switching circuitry 44 is shown when switch 48 is open. When switch 48 is open, no current flows from the power source 50. Also, current flows into resistive voltage divider 56 through switch 48 to ground, driving the NPN transistor 58 off. This turns NPN Darlington pair 60 on, causing current flow through resistor 46 and discharging capacitive load 54. The rate of discharge is determined by the value of resistor 46 and capacitive load 54. Resistor 62 and NPN transistor 58 serve as a level translator between the switched power and control signal so the switched power and control signal do not have to have the same voltage levels.

Figure 5:
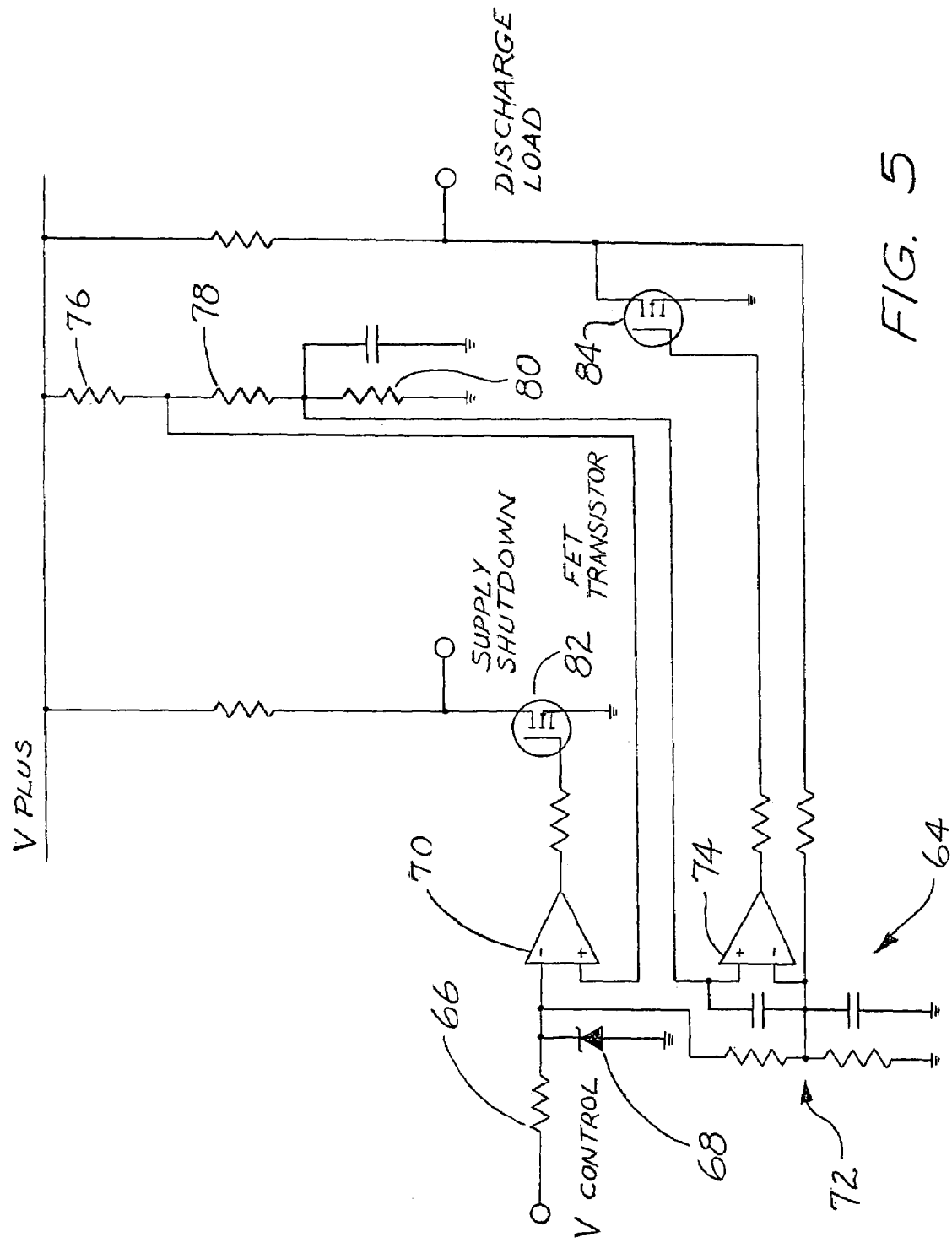
FIG. 5 is an electronic schematic of the control circuit of the present invention.

Referring now to FIG. 5, the control circuit 64 of FIG. 1 is shown isolated to better illustrate the operative features of the circuit 64. Analog control voltage flows through resistor 66 and is clamped by Zener diode 68 at a preset voltage so as not to damage the input of operational amplifier 70. Further, resistor 66 is part of resistive voltage divider network 72. The network 72 provides two voltages; one voltage is the reference to shut the DC to DC converter 12 down, the other, a reference to actively discharge the capacitive load. Operational amplifier 70 is used in a voltage comparator mode that is associated with the DC to DC converter 12 shutdown mode. Operational amplifier 74 is used in a voltage comparator mode and is associated with the active discharge mode. Resistors 76, 78, 80 form a second resistive voltage divider network. This network monitors the capacitive load voltage and derives the voltages that operational amplifiers 70, 74 compare to the reference voltages derived from resistors 66, 72. When the voltage at the non-inverting terminal of operational amplifier 70 is greater than the voltage at the inverting terminal, the output of the amplifier goes to the positive saturation state, turning FET transistor 82 on and causing the DC to DC converter to stop.

When the voltage at the inverting terminal of operational amplifier 70 is greater than that at the non-inverting terminal, the output of the amplifier goes to the negative saturation state, turning FET transistor 82 off and causing the DC to DC converter to run. When the voltage at the non-inverting terminal of operational amplifier 74 is greater than that at the inverting terminal the output of the amplifier goes to the positive saturation state, turning FET transistor 84 on and causing the active discharge of capacitive load. When the voltage at the inverting terminal of operational amplifier 74 is greater than the voltage at the non-inverting terminal, the output of the amplifier goes to the negative saturation state, turning FET transistor 84 off. In this system there are three distinct states, (1) DC to DC converter on and capacitive load discharge switch open, (2) DC to DC converter off and capacitive load discharge switch open, and (3) DC to DC converter off and capacitive load discharge switch closed.

In the embodiment illustrated in FIGS. 1, 2, 3, 4, and 5, the components have been chosen for their current carrying ability, voltage rating, and type. Other suitable components can include FET small signal, and power transistors, wire wound, thin film, and carbon comp resistors, ceramic, tantalum, and film capacitors, or any combination of suitable components commonly used for high volume production. Although these materials given as examples provide excellent performance, depending on the requirements of an application, use of other combinations of components can be appropriate. Likewise, the embodiment illustrates components that are commercially available.

While the invention has been described in conjunction with what is presently considered to be the most practical and preferred embodiment, it is to be understood that the invention is not to be limited to the disclosed embodiment but, on the contrary, it is intended to cover various modifications and equivalent arrangements included within the spirit and scope of the appended claims, which scope is to be accorded the broadest interpretation so as to encompass all such modifications and equivalent structures as permitted under law.

What is claimed is:

1. An apparatus for charging and discharging a capacitor to predetermined setpoints comprising:
   a smart material actuator,
   a voltage controlled DC to DC converter for operating the smart material actuator in a proportional manner;
   a constant supply voltage supply the voltage controlled DC to DC converter; and
   a control signal providing a selectable input voltage wherein an output voltage of the DC to DC converter is applied to the smart material actuator and wherein the output voltage is proportional to the selectable input voltage.

2. The apparatus of claim 1, wherein the voltage controlled DC to DC converter further comprises a self-oscillating drive circuit connected to a primary coil of a transformer with drive signals 180 degrees out of phase.

3. The apparatus of claim 2, wherein the voltage controlled DC to DC converter further comprises an auxiliary coil on the transformer.

4. The apparatus of claim 2, wherein the voltage controlled DC to DC converter further comprises an attached diode rectifier to generate a DC voltage from an AC signal of a secondary coil on the transformer.

5. The apparatus of claim 2, wherein the voltage controlled DC to DC converter further comprises a voltage feedback network for voltage regulation.

6. The apparatus of claim 2, wherein the voltage controlled DC to DC converter further comprises 2 NPN transistors defining a push-pull transformer driver.

7. The apparatus of claim 2, wherein the voltage controlled DC to DC converter further comprises control circuitry for stopping and starting the self-oscillating mechanism.

8. The apparatus of claim 2, wherein the transformer is of wound core design.

9. The apparatus of claim 2, wherein the transformer is of LTCC design.

10. The apparatus of claim 1, wherein the voltage controlled DC to DC converter further comprises a diode on an input stage for reverse polarity protection.

11. The apparatus of claim 1, wherein the converter further comprises both a bead inductor and bypass capacitor for suppression of radiated EMI into a power source.

12. The apparatus of claim 1 further comprising a smart material drive circuit for actively charging and discharging the smart material actuator in response to connecting and disconnecting a power source respectively.

13. The apparatus of claim 1 further comprising a smart material drive circuit for actively controlling at least one of charging and discharging the smart material actuator in response to the control signal.

14. The apparatus of claim 1, further comprising:
   a first comparator receiving a first reference voltage related to an analog control voltage and receiving a first load voltage related to a voltage of the smart material actuator;
   a first switch receiving an input from the first comparator;
   a second comparator receiving a second reference voltage related to the analog control voltage and receiving a second load voltage related to the voltage of the smart material actuator;
   a second switch receiving an input from the second comparator, and wherein when the first load voltage is greater than the first reference voltage, the first switch prevents the DC to DC converter from supplying power to the smart material actuator; and
   wherein when the first reference voltage is greater than the first load voltage, the first switch allows the DC to DC converter to supply power to the smart material actuator; and wherein when the second load voltage is greater than the second reference voltage, the second switch causes the smart material actuator to discharge.

15. An apparatus for charging and discharging a capacitor to predetermined setpoints comprising:
   a smart material actuator;
   a power source connectible to the smart material actuator; and
   a switch circuit for actively discharging the smart material actuator in response to removal of the connection to the power source.

16. The apparatus of claim 15 further comprising the switch circuit for actively charging the smart material actuator in response to connecting the power source.

17. The apparatus of claim 15 further comprising the switch circuit for actively controlling charging and discharging the smart material actuator in response to a control signal input.

18. The apparatus of claim 15 further comprising the switch circuit for actively controlling at least one of charging and discharging the smart material actuator in response to a control signal.

19. The apparatus of claim 15, wherein the switch circuit further comprises a voltage comparator and FET transistor to control a DC to DC converter.

20. The apparatus of claim 19, wherein the switch circuit has three operational modes, charge load, hold load and discharge load.

21. The apparatus of claim 15, wherein the switch circuit further comprises a voltage comparator and FET transistor to control an active discharge of the smart material actuator.

22. The apparatus of claim 21, wherein the switch circuit has three operational modes, charge load, hold load and discharge load.

23. The apparatus of claim 15, wherein the switch circuit for actively discharging further includes a controllable electrical connection switchable between an open state and a closed state in order to ground the smart material actuator, thereby causing active discharge of capacitive load in response to removal of the power source connection to the smart material actuator.

24. A method for charging and discharging a capacitor to predetermined setpoints comprising the steps of:
   providing a smart material actuator;
   operating the smart material actuator in a proportional manner with a voltage controlled DC to DC converter;
   supplying a constant supply voltage to the voltage controlled DC to DC converter; and
   providing a control signal having a selectable input voltage wherein an output voltage of the DC to DC converter is applied to the smart material actuator and wherein the output voltage is proportional to the selectable input voltage.

25. The method of claim 24 further comprising the step of connecting a self-oscillating drive circuit to a primary coil of a transformer with drive signals 180 degrees out of phase.

26. The method of claim 25 further comprising the step of providing an auxiliary coil on the transformer.

27. The method of claim 25 further comprising the step of attaching a diode rectifier to generate a DC voltage from an AC signal of a secondary coil on the transformer.

28. The method of claim 25 further comprising the step of feeding back a voltage signal for voltage regulation.

29. The method of claim 25 further comprising the step of providing two NPN transistors defining a push-pull transformer driver.

30. The method of claim 25 fixer comprising the step of stopping and starting the self-oscillating mechanism with control circuitry.

31. The method of claim 24 further comprising the step of providing a diode on an input stage for reverse polarity protection.

32. The method of claim 24 further comprising the step of suppressing radiated EMI into a power source with both a bead inductor and bypass capacitor.

33. The method of claim 24 further comprising the step of actively charging and discharging the smart material actuator in response to connecting and disconnecting a power source respectively with a smart material drive circuit.

34. The method of claim 24 further comprising the step of actively controlling at least one of charging and discharging the smart material actuator in response to the control signal with a smart material drive circuit.

35. The method of claim 24, further comprising the steps of:
   comparing a first reference voltage related to an analog control voltage with a first load voltage related to a voltage of the smart material actuator;
   comparing a second reference voltage related to the analog control voltage with a second load voltage related to the voltage of the smart material actuator;
   switching the DC to DC converter off when the first load voltage is greater than the first reference voltage;
   switching the DC to DC converter off when the first reference voltage is greater than the first load voltage; and
   discharging the smart material actuator when the second load voltage is greater than the second reference voltage.

36. A method for charging and discharging a capacitor to predetermined setpoints comprising the steps of:
   providing a smart material actuator;
   connecting a power source to the smart material actuator; and
   actively discharging the smart material actuator in response to removal of the connection to the power source with a switch circuit.

37. The method of claim 36 further comprising the step of actively charging the smart material actuator in response to connecting the power source with the switch circuit.

38. The method of claim 36 further comprising the step of actively controlling charging and discharging the smart material actuator in response to a control signal input with the switch circuit.

39. The method of claim 36 further comprising the step of actively controlling at least one of charging and discharging the smart material actuator in response to a control signal with the switch circuit.

40. The method of claim 36 further comprising the step of controlling a DC to DC converter with a voltage comparator and FET transistor.

41. The method of claim 40, wherein the switch circuit has three operational modes, charge load, hold load and discharge load.

42. The method of claim 36 further comprising the step of controlling an active discharge of the smart material actuator with the switch circuit.

43. The method of claim 42, wherein the switch circuit has three operational modes, change load, hold charge and discharge load.

44. The method of claim 36, wherein the step of actively discharging further includes the step of:
   switching a controllable electrical connection between an open state and a closed state in order to ground the smart material actuator, thereby causing active discharge of capacitive load in response to removal of the power source connection to the smart material actuator.

* * * * *